(12) United States Patent
Bancel et al.

(10) Patent No.: US 7,484,152 B2
(45) Date of Patent: Jan. 27, 2009

(54) SECURING THE TEST MODE OF AN INTEGRATED CIRCUIT

(75) Inventors: Frederic Bancel, Lamanon (FR); David Hely, Les Pennes Mirabeau (FR)

(73) Assignee: STMicoelectronics SA, Montrouge (FR)

( * ) Notice: Subject to any disclaimer, the term of this patent is extended or adjusted under 35 U.S.C. 154(b) by 403 days.

(21) Appl. No.: 11/351,344

(22) Filed: Feb. 8, 2006

(65) Prior Publication Data

US 2006/0195723 A1 Aug. 31, 2006

(30) Foreign Application Priority Data

Feb. 8, 2005 (FR) ................................. 05 01266

(51) Int. Cl.
*G01R 31/28* (2006.01)
(52) U.S. Cl. .................................................. 714/730
(58) Field of Classification Search ................. 714/724, 714/730
See application file for complete search history.

(56) References Cited

U.S. PATENT DOCUMENTS

| | | | |
|---|---|---|---|
| 5,150,044 A | | 9/1992 | Hashizume et al. |
| 6,191,603 B1 * | | 2/2001 | Muradali et al. ............. 324/765 |
| 6,499,124 B1 * | | 12/2002 | Jacobson ..................... 714/727 |
| 6,601,202 B2 * | | 7/2003 | Palm et al. ................... 714/726 |
| 7,231,552 B2 * | | 6/2007 | Parker et al. .................. 714/30 |
| 7,234,091 B2 * | | 6/2007 | Liang ......................... 714/727 |
| 2004/0083414 A1 | | 4/2004 | Parker et al. |

* cited by examiner

*Primary Examiner*—James C Kerveros

(57) ABSTRACT

An electronic circuit includes a logic circuit formed from a plurality of logic units. The electronic circuit also includes a plurality of memory units capable of forming a shift register, capable of being connected to the logic units, and having terminals for reception of command signals to write data into the logic units and to read data from the logic units. The electronic circuit further includes an access controller having a plurality of outputs connected to the terminals of the memory units and capable of applying the command signals to the outputs. In addition, the electronic circuit includes a scrutinizing module capable of a plurality of functions.

20 Claims, 4 Drawing Sheets

(PRIOR ART)

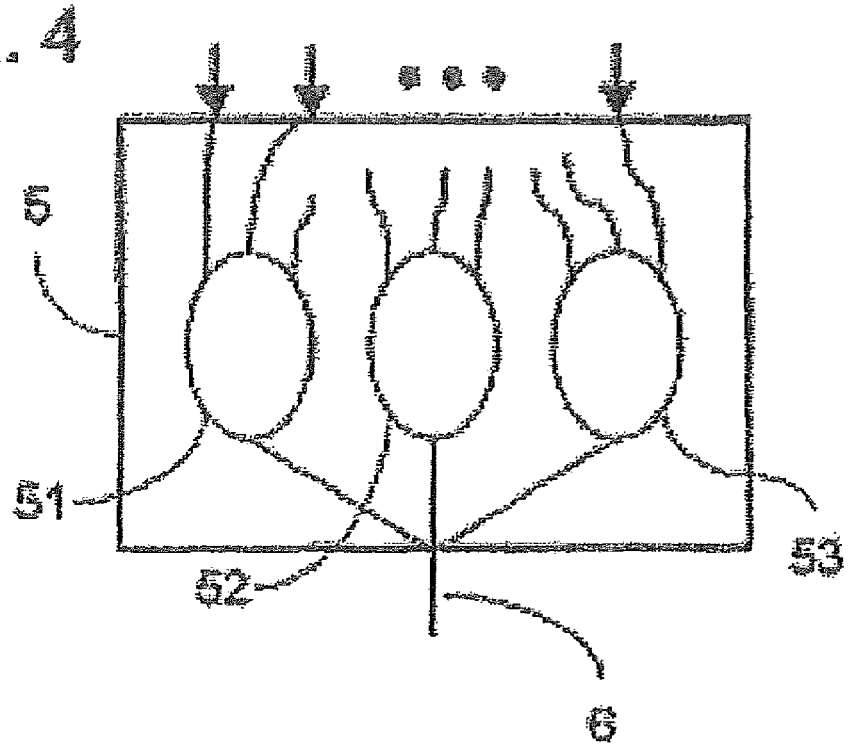

SECURING THE TEST MODE OF AN INTEGRATED CIRCUIT

TECHNICAL FIELD OF THE INVENTION

This invention generally relates to integrated circuits and more specifically to securing the test mode of an integrated circuit.

BACKGROUND OF THE INVENTION

Testing the correct operation of functional elements of an integrated circuit is well known today by setting or determining, at predefined times, data values present at certain internal points of the integrated circuit. Such a technique for testing internal paths of an integrated circuit (referred to as the "scan-path" or the "internal scan method") is described, for example, in the publication of M. Williams and J. Angel, entitled "Enhancing Testability of LSI Circuits Via Test Points and Additional Logic," IEEE Transactions on Computers, vol. C-22, no. 1, January 1973.

According to this technique, each of the flip-flops of the logic circuit, of which it is useful to know the state or to set the content during the normal operating mode of the integrated circuit, is furnished with a multiplexer at its input. The various flip-flops and the multiplexers that are associated with them therefore constitute many configurable units, the accesses of which are individually controlled by these multiplexers. The multiplexers of these different configurable units are collectively controlled by an access controller or "TAP controller" ("TAP" for "Test Access Port") which, according to a chosen operating mode, utilizes this group of configurable units either as a normal functional circuit integrated into the logical circuit that it forms with the logic units or as a test circuit. To do this, the TAP controller addresses command signals to various command drivers, through which it is connected to the various configurable units. The command signals may include a mode command signal, a chaining command signal or even a data propagation command signal, which modifies the circulation paths of data within the integrated circuit and thus allows the capture of these data by the controller for their analysis.

In standard operating mode, the TAP controller therefore drives the multiplexers of the configurable units so that the flip-flops of these units are connected to surrounding logic units to define one or a plurality of functional sub-groups of the integrated circuit.

In the test mode, which is normally activated with the receipt by the TAP controller of a test execution command, this controller produces a chaining command signal to connect the flip-flops of the configurable units in a series so as to form a shift register. This register includes, in particular, a serial input and a serial output respectively connected with an output and an input of the TAP controller, as well as a clock input receiving a clock signal to synchronize the data flow. First, the TAP controller serially loads data into the flip-flops of the configurable units through the input of the shift register that these units form. Then the TAP controller changes the switching of the multiplexers to form the functional circuit and commands the execution of one or a plurality of clock cycles by this functional circuit. The data loaded into the flip-flops of the configurable units are then processed by the functional circuit. The controller then changes the switching of the multiplexers to form the shift register again and recovers, serially from the output of the shift register, the data memorized in the flip-flops of the configurable units during the final clock cycle.

Despite the confirmed advantage of this testing technique, its practical application can in certain circumstances prove to be problematic, in particular on integrated circuits that process secure data. Indeed, insofar as the activation of the test mode can allow an unauthorized user to read the contents of the flip-flops of the configurable units, this testing technique presents, in principle, the drawback of making such circuits very vulnerable to unauthorized use. For example, by stopping an internal loading process for secret data into the integrated circuit and by unloading the contents of the shift register, an unauthorized user can determine that the units whose flip-flops are changing state contain the secret data. The unloading of the shift register at an opportune moment then allows the unauthorized user to recover the secret data. By activating the test mode, an unauthorized user could also obtain write-access to the flip-flops of the configurable units in order to insert fraudulent data or to place the integrated circuit into a non-authorized configuration. He or she could thus, for example, access a register controlling a security component such as a sensor or could deactivate it. He or she could also inject erroneous data in order to obtain information on a secret data item.

The unauthorized access can in fact adopt two different strategies. The first strategy consists of taking control of the TAP controller and observing the contents of the shift register's units through external contacts. The second strategy consists of taking control of the configurable units by exciting them through a microprobe so as to simulate the driving of these units by the command signals that the TAP controller transmits, as illustrated in FIG. 1. A microprobe for a single unit then allows one to obtain the collection of data placed upstream in the shift register. If the units of the shift register are synchronous, it would not even be necessary to take control of the test clock, as the standard functioning mode clock permits the generation of the shift.

As shown in FIG. 1, an unauthorized user can relatively easily identify one of the units 3 belonging to the shift register 1 and its input receiving the command signal from the TAP controller 2. It is then relatively easy to follow the electronic trail linking this input to reach the source of the command signal from the TAP controller (output 21 of the TAP controller 2 or connection contact of a TAP controller). A microprobe 4 applied at the level of the source of the command signal allows one to simulate a test mode with the group of shift register units.

There exists therefore a need for an electronic circuit that overcomes one or a plurality of these drawbacks.

SUMMARY OF THE INVENTION

To address the above-discussed deficiencies of the prior art, one aspect of the invention therefore relates to an electronic circuit, comprising:

a logic circuit comprising a plurality of logic units;

a plurality of memory units capable of forming a shift register, capable of being connected to the logic units, and having terminals for reception of command signals to write data into the logic units and to read data from the logic units;

an access controller having a plurality of outputs connected to the terminals of the memory units and capable of applying the command signals to the outputs; and a scrutinizing module capable of measuring at least one signal between at least one of the outputs of the access controller and the reception terminal of at least one of the memory units, determining if the at least one measured signal differs from the at least one command signal applied to the at least one output by the access controller, and blocking formation of the shift register if a difference is determined.

According to one variant, the access controller phase-shifts the command signals in relationship to each other.

According to another variant, a clock circuit applies a clock signal to the clock input of each memory unit after the phase-shifted command signals have been generated.

According to a further variant, the access controller applies a signal and its complement to various outputs.

According to yet another variant, the access controller further comprises flip-flop circuits having outputs that are connected to the outputs of the access controller.

According to a variant, the access controller comprises a state machine intervening in the generation of the command signals applied to the outputs of the access controller.

According to another variant, the state machine receives, at an input, a test mode validation code and/or functioning state signals from the electronic circuit.

According to yet another variant, the scrutinizing module generates given signals according to the same logic as the access controller and compares the given signals to the measured signals.

According to one variant, the scrutinizing module comprises a state machine intervening in the generation of the given signals.

According to another variant, the scrutinizing module orders a power cut-off to the electronic circuit, a re-initialization of the electronic circuit, and/or the erasure of the contents of the memory units when a measured signal differs from a given signal.

Before undertaking the DETAILED DESCRIPTION OF THE INVENTION below, it may be advantageous to set forth definitions of certain words and phrases used throughout this patent document. The terms "include" and "comprise," as well as derivatives thereof, mean inclusion without limitation. The term "or," is inclusive, meaning and/or. The phrases "associated with" and associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The terms "couple" and "connect" and their derivatives refer to any direct or indirect communication between two or more elements, whether or not those elements are in direct physical contact with one another. The term "controller" means any device, system or part thereof that controls at least one operation. Such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

Other features and advantages of the invention will become more evident in the description that is given below, for indicative reasons and in no way limiting, in reference to the attached drawings, in which like reference numerals represent like parts, and in which:

FIG. 4 represents an example of a scrutinizing module according to the invention.

DETAILED DESCRIPTION

Figure 1:
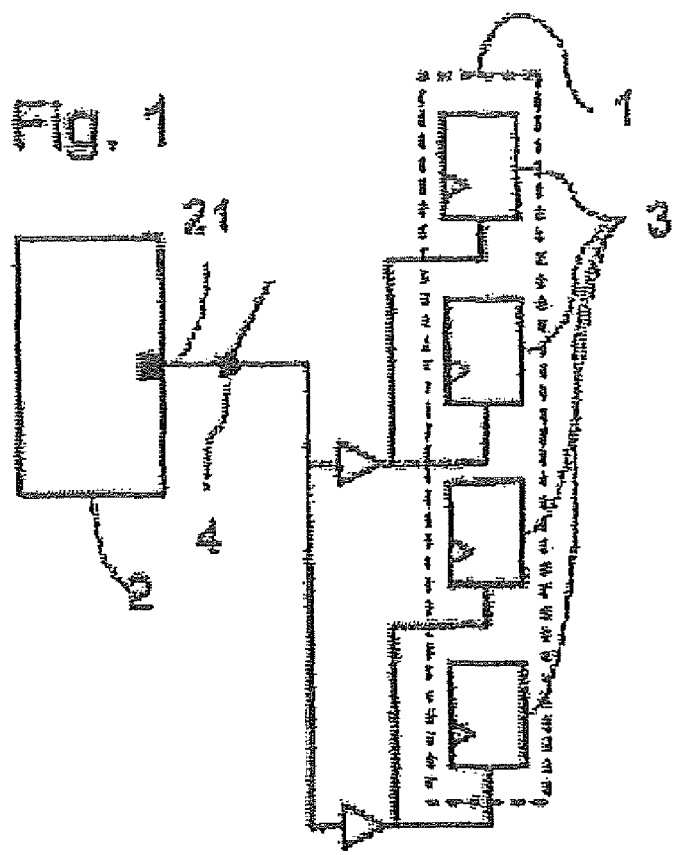
FIG. 1 represents an integrated circuit according to prior art being subjected to an unauthorized simulation of a test by a microprobe.
Figure 2:
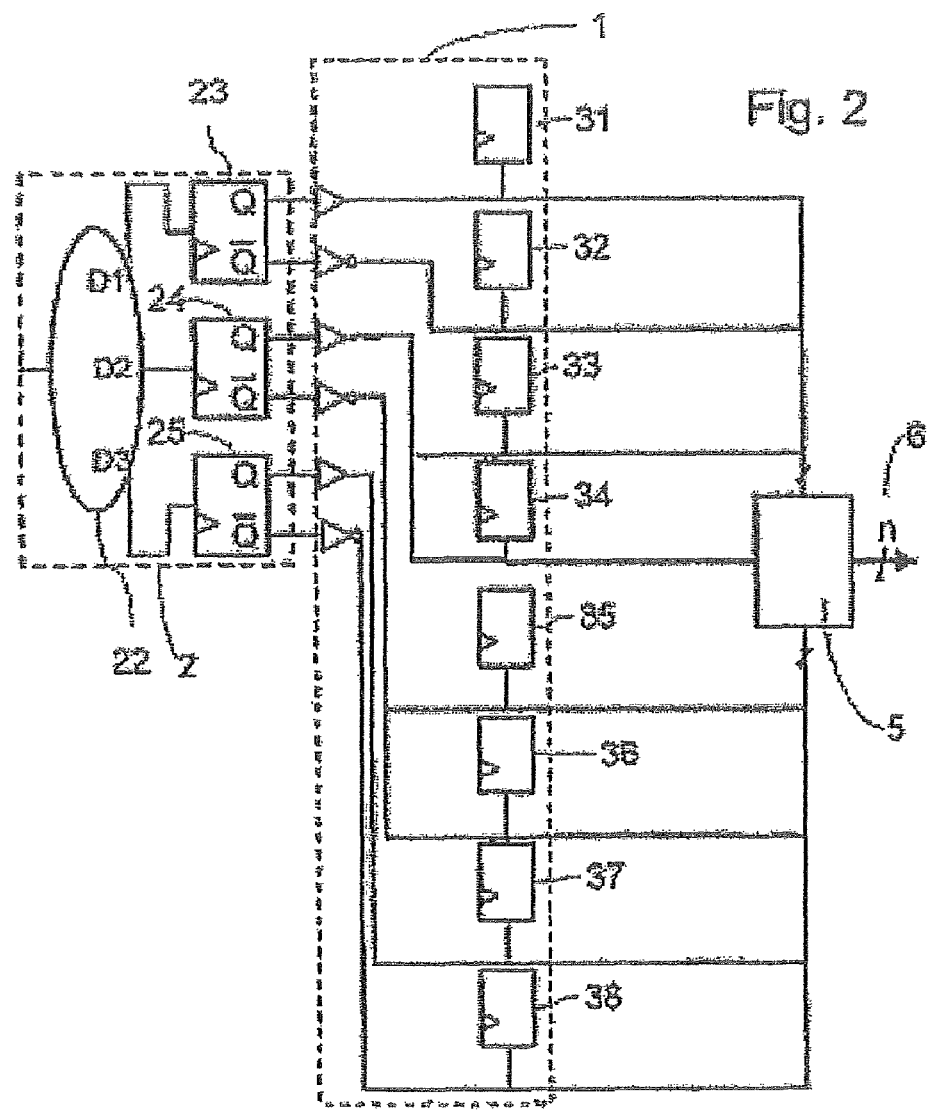
FIG. 2 represents an example of an integrated circuit according to the invention.
Figure 3:
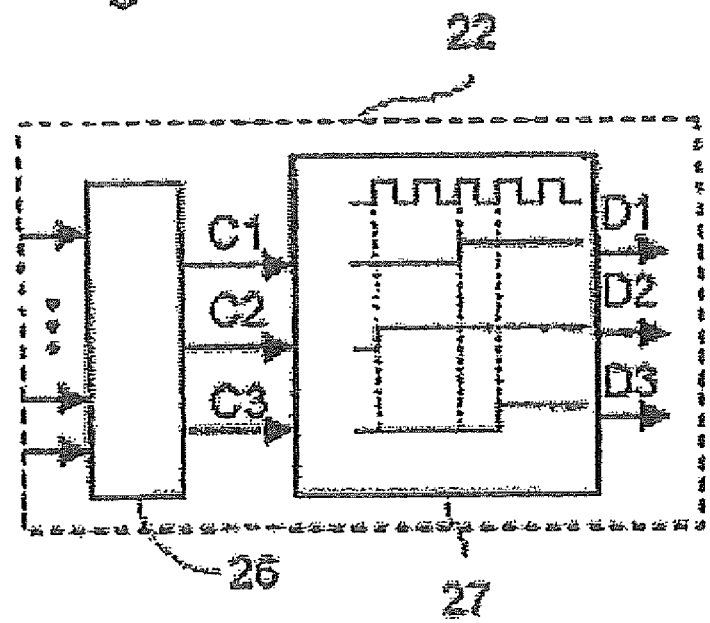
FIG. 3 represents an example of a TAP controller according to the invention.

FIGS. 2 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged circuit, device, or system.

The invention proposes the generation of a plurality of distinct command signals for memory units on outputs of an access controller. A scrutinizing module measures the command signals between the outputs and reception terminals of the memory units. The scrutinizing module blocks the formation of a shift register if the signal measured differs from the corresponding command signal applied to the output of the access controller.

The invention therefore forces an unauthorized user to place multiple microprobes to switch the shift register from a normal operating mode to a test operating mode. As the number of necessary microprobes increases, the realization of this unauthorized access becomes more difficult. Indeed, the number of microprobes that one must apply to a circuit is limited, and the management of the synchronization of multiple probes proves to be difficult. The security of the test mode is therefore enhanced.

FIG. 2 illustrates an example of an electronic circuit comprising an access controller 2 and a scrutinizing module 5 according to the invention. The electronic circuit presents logic units (not illustrated) and memory units 31 through 38 suited for forming a shift register 1 and for connection to the logic units. The memory units 31 through 38 present terminals receiving respective command signals for commanding their reading or their writing. The reception terminals for the command signals are connected to the outputs of the access controller 2.

The access controller 2 comprises a state machine 22 generating a plurality of distinct intermediary signals D1, D2 and D3. The intermediary signals D1, D2 and D3 are notably phase-shifted in relationship to each other. An example of an implementation of the state machine shall be described more precisely in reference to FIG. 3.

The intermediary signals D1, D2 and D3 are applied respectively to the inputs of flip-flop switches 23 through 25. The outputs Q and Q-bar of the flip-flops 23 through 25 form the outputs of the access controller 2. Thus, at each clock pulse, the flip-flops 23 through 25 reproduce the signals D1 through D3 as well as their complements on the outputs of the access controller 2. The command signals generated by access controller 2 are therefore distinguished by their phase-shift and their logic level.

Inverters are provided on the inputs of the memory units whose reception terminal is connected to an output Q-bar of a flip-flop. The reception terminals for the memory units are connected to the outputs of the access controller 2 in the following manner:

Unit 31: Flip-flop 23, output Q;
Unit 32: Flip-flop 23, output Q-bar;
Unit 33: Flip-flop 24, output Q;
Unit 34: Flip-flop 24, output Q;
Unit 35: Flip-flop 24, output Q-bar;
Unit 36: Flip-flop 24, output Q-bar;
Unit 37: Flip-flop 25, output Q;
Unit 38: Flip-flop 25, output Q-bar.

Thus, the distinct reception terminals can be connected to a common output of the access controller 2.

FIG. 3 details the generation of the intermediary signals D1 through D3 in state machine 22. Signals are applied to the inputs of a combinatory logic circuit 26. This circuit 26 generates signals C1 through C3 corresponding to logic combination between the input signals. Signals C1 through C3 are applied to the inputs of a sequencing block 27. This block 27 phase-shifts the signals C1 through C3 from one or a plurality of clock cycles and provides at the outputs the intermediary signals D1 through D3.

The signals applied to the inputs of the circuit 26 are, for example, the bits of an authentication register, signals of a particular state of operation of the electronic circuit, and/or the test mode activation signal Shift_DR. The bits from the authentication register are a locking code known only by authorized persons and written in the authentication register when the circuit is in an operating mode.

The utilization of a combinatory logic circuit 26 generating a plurality of signals C1 through C3 and of a sequencing block 27 makes taking control of the access controller 2 particularly difficult for an unauthorized user. Indeed, the generation of various output signals is then relatively independent. The unauthorized user would then not be able to generate the group of signal commands by just applying a single stimulation microprobe to the access controller 2.

The scrutinizing module 5 measures the signals applied to the connections between an output of the access controller 2 and a reception terminal. The closer the measurement point is to the reception terminal, the more the scrutinizing module 5 itself will be able to detect a fraudulent modification of the signal over the connection. In the illustrated example, each measurement point is positioned at the level of the reception terminal of a memory unit. However, in order to not create a substantial a number of measurement points, a person skilled in the art may position certain measurement points on connection branches common to multiple connection terminals.

The scrutinizing module 5 compares the measured signals to given signals. The scrutinizing module can generate the given signals by utilizing the same logic as the access controller 2. The scrutinizing module 5 determines an attempt at unauthorized access when a measured signal differs from a corresponding given signal.

The scrutinizing module 5 can also utilize an inverse logic and evaluate input signals from the state machine 22 that lead to the measured command signals. The scrutinizing module 5 then measures the real value of the input signals from the state machine 22. If the real value and the determined value differ, the scrutinizing module 5 determines an attempt at unauthorized access.

The scrutinizing module 5 can block the formation of the shift register 1 by all appropriate means: a cut-off of the power to one or a plurality of components of the electronic circuit, re-initialization of the electronic circuit, and/or erasure of the contents of certain memory units. If an unauthorized access is detected, the scrutinizing module 5 generates a corresponding signal on the output 6.

A fraudulent transition to the test mode is therefore particularly difficult. The unauthorized user must generate the different given command signals to be able to mislead the scrutinizing module 5. This unauthorized access is particularly difficult when the different command signals are phase-shifted. Furthermore, even if the microprobes are placed between the measurement points and the reception terminals, their number must then be greatly increased due to the reduction of the branches originating from an output of the access controller. Placing efficiently a sufficient number of microprobes will therefore be practically impossible.

An example of scrutinizing module 5 is illustrated by FIG. 4. The scrutinizing module 5 receives as input the signals from different measurement points. These signals are applied to the inputs of three state machines 51 through 53. The scrutinizing module 5 generates corresponding intermediary signals from the measured signals. By comparing the signals generated with the given intermediary signals D1 through D3, the scrutinizing module 5 detects a possible unauthorized access. Although multiple state machines have been illustrated, one single state machine can implement the same functions.

When the command signals are phase-shifted, the various memory units that must form the shift register in test mode are synchronized. For example, one provides for an external clock signal to be applied to the clock input of each memory unit. A user therefore thus applies a clock signal to the clock inputs when it is certain that all the phase-shifted command signals have been applied to the reception terminals, that is to say, at the end of the transitory period during which only certain command signals are applied. The application of an internal clock signal to the clock inputs of the units may also be blocked until the end of the transitory period.

The memory units can present a structure well known to a person skilled in the art. The memory units can, in particular, comprise a multiplexer modifying the connection of the input of a flip-flop according to the chosen operating mode.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of the invention, as defined by the following claims.

What is claimed is:

1. An electronic circuit, comprising:
 a logic circuit comprising a plurality of logic units;
 a plurality of memory units of a shift register connected to the plurality of logic units, and having reception terminals for reception of command signals;
 an access controller having a plurality of outputs connected to the reception terminals of the plurality of memory units and applying the command signals to the outputs; and
 a scrutinizing module measuring at least one command signal between an output of the access controller and a reception terminal of a memory unit, determining if the measured signal differs from the command signal applied to the output of the access controller, and blocking formation of the shift register.

2. The electronic circuit according to claim 1, wherein the access controller is further capable of shifting a phase of a first command signal relative to a phase of a second command signal.

3. The electronic circuit according to claim 1, wherein the access controller generates a first command signal as a logical complement of a second command signal.

4. The electronic circuit according to claim 3, wherein the access controller comprises a state machine generating the command signals applied to the outputs of the access controller, the state machine receiving one of: a test mode validation code, and functioning state signals from the electronic circuit.

5. The electronic circuit according to claim 1, wherein the scrutinizing module:
generates a signal according to logic that is also used by the access controller to generate the command signal applied to the output of the access controller; and
compares the generated signal to the measured signal.

6. The electronic circuit according to claim 1, wherein, when the measured signal differs from the command signal applied to the output of the access controller, the scrutinizing module is configured to perform an action selected from the group:
causing a power cut-off to the electronic circuit, re-initializing the electronic circuit, and
erasing contents of the memory units.

7. The electronic circuit according to claim 1, wherein the scrutinizing module is configured to perform an action selected from the group of;
generating an inverse signal based upon the measured signal; and
comparing the inverse signal to the command signal applied to the output of the access controller.

8. An apparatus for use in an electronic circuit comprising a plurality of logic units and a plurality of memory units coupled to the plurality of logic units, the plurality of memory units capable of forming a shift register and capable of receiving command signals at reception terminals, the apparatus comprising:
an access controller sending command signals to the reception terminals; and
a scrutinizing module detecting for at least one command signal sent from the access controller to a reception terminal whether the command signal received at the reception terminal differs from the command signal sent from the access controller,
wherein the scrutinizing module blocking formation of a shift register if a difference is detected.

9. The apparatus of claim 8, wherein the access controller generates a first command signal as a logical complement of a second command signal.

10. The apparatus of claim 8, wherein the access controller shifts a phase of a first command signal relative to a phase of a second command signal.

11. The apparatus of claim 8, wherein the access controller generates a plurality of command signals based upon one of: a plurality of bits of an authentication register, a plurality of signals indicating a state of operation of the electronic circuit, and a test mode activation signal.

12. The apparatus of claim 8, wherein the scrutinizing module generates a signal that duplicates the command signal sent from the access controller and comparing the command signal received at the reception terminal with the generated signal to detect a difference between the command signal sent from the access controller and the command signal received at the reception terminal.

13. The apparatus of claim 8, wherein the scrutinizing module generates an inverse signal based upon the command signal received at the reception terminal and comparing the command signal actually sent from the access controller with the inverse signal to detect a difference between the command signal sent from the access controller and the command signal received at the reception terminal.

14. The apparatus of claim 12, wherein the scrutinizing module blocks formation of a shift register by one of: disconnecting one or more components of the electronic circuit from a power supply, re-initializing the electronic circuit, and erasing data in one or more of the plurality of memory units.

15. A method for use with an electronic circuit comprising a plurality of logic units and a plurality of memory units coupled to the plurality of logic units, the plurality of memory units forming a shift register and receiving command signals at reception terminals, the apparatus comprising:
sending command signals to the reception terminals;
detecting for at least one command signal sent to a reception terminal whether the command signal received at the reception terminal differs from the command signal sent to the reception terminal; and
blocking formation of a shift register if a difference is detected.

16. The method of claim 15, further comprising:
shifting a phase of a first command signal relative to a phase of a second command signal.

17. The method of claim 15, further comprising:
generating a plurality of command signals based upon one of: a plurality of bits of an authentication register, a plurality of signals indicating a state of operation of the electronic circuit, and a test mode activation signal.

18. The method of claim 15, wherein detecting whether the command signal received at the reception terminal differs from the command signal sent to the reception terminal further comprises:
generating a signal that duplicates the command signal sent to the reception terminal; and
comparing the command signal received at the reception terminal with the generated signal.

19. The method of claim 15, wherein detecting whether the command signal received at the reception terminal differs from the command signal sent to the reception terminal further comprises:
generating an inverse signal based upon the command signal received at the reception terminal; and
comparing the actual command signal sent to the reception terminal with the inverse signal.

20. The method of claim 15, wherein blocking formation of a shift register further comprises one of:
disconnecting one or more components of the electronic circuit from a power supply;
reinitializing the electronic circuit; and
erasing data in one or more of the plurality of memory units.

* * * * *